(12) United States Patent
Sakai

(10) Patent No.: US 8,020,054 B2
(45) Date of Patent: Sep. 13, 2011

(54) TEST APPARATUS AND TEST METHOD

(75) Inventor: Kohji Sakai, Kanagawa (JP)

(73) Assignee: Advantest Corporation, Tokyo (JP)

( * ) Notice: Subject to any disclaimer, the term of this patent is extended or adjusted under 35 U.S.C. 154(b) by 86 days.

(21) Appl. No.: 12/540,990

(22) Filed: Aug. 13, 2009

(65) Prior Publication Data

US 2010/0042880 A1 Feb. 18, 2010

Related U.S. Application Data

(63) Continuation of application No. PCT/JP2008/052377, filed on Feb. 13, 2008.

(30) Foreign Application Priority Data

Feb. 16, 2007 (JP) ................................. 2007-036361

(51) Int. Cl.
G11C 29/00 (2006.01)
G11C 7/00 (2006.01)

(52) U.S. Cl. ......... 714/718; 714/719; 714/723; 365/201

(58) Field of Classification Search .................. None
See application file for complete search history.

(56) References Cited

U.S. PATENT DOCUMENTS

| | | | | |
|---|---|---|---|---|
| 5,577,050 | A * | 11/1996 | Bair et al. ...................... | 714/710 |
| 5,825,783 | A | 10/1998 | Momohara | |
| 6,477,672 | B1 * | 11/2002 | Satoh ............................ | 714/721 |
| 2002/0194558 | A1 * | 12/2002 | Wang et al. .................... | 714/718 |
| 2005/0193233 | A1 * | 9/2005 | Magliocco et al. ............... | 714/5 |
| 2007/0067685 | A1 | 3/2007 | Yamada et al. | |

FOREIGN PATENT DOCUMENTS

| | | |
|---|---|---|
| JP | 09-145790 A | 6/1997 |
| JP | 2007-12221 A | 1/2007 |
| JP | 2007-257684 A | 10/2007 |
| WO | 2005-091305 A1 | 9/2005 |

OTHER PUBLICATIONS

Filho, C.K. ; Kastensmidt, F.L. ; Carro, L. ; Improving Reliability of SRAM-Based FPGAs by Inserting Redundant Routing, Issue Date : Sep. 19-23, 2005, Radiation and Its Effects on Components and Systems, 2005. RADECS 2005. 8th European Conference.*

(Continued)

*Primary Examiner* — Guerrier Merant
(74) *Attorney, Agent, or Firm* — Chen Yoshimura LLP

(57) ABSTRACT

A test apparatus provided in common for a plurality of memories under test, comprising an address generating section that sequentially generates addresses to be tested in the memories under test and a plurality of buffer memories that are provided to correspond respectively to the memories under test and that each store addresses to be independently supplied to the corresponding memory under test. The test apparatus (i) compares block data output by a memory under test in response to a read command to an expected value of this block data, for each generated address, (ii) sequentially stores, in the corresponding buffer memory and in response to detection of a discrepancy in the comparison, the address generated for reading the block data, and (iii) writes, in parallel to the plurality of memories under test, disable data that includes, as individual addresses, the addresses stored in the buffer memory.

6 Claims, 18 Drawing Sheets

OTHER PUBLICATIONS

Radiation and Its Effects on components and Systems, 2005. RADECS 2005. 8th European Conference.*

An embedded processor based SOC test platform, Kuen-Jong Lee ; Chia-Yi Chu ; Yu-Ting Hong ;This paper appears in: Circuits and Systems, 2005. ISCAS 2005. IEEE International Symposium on Issue Date : May 23-26, 2005 on p. 2983.*

Kuen-Jong Lee, Chia-Yi Chu, Yu-Ting Hong, An Embedded Processor Based SOC Test Platform, 2005, IEEE, pp. 1-4.*

International Search Report (ISR) for PCT/JP2008/052377.

Written Opinion (PCT/ISA/237) of PCT/JP2008/052377 and its English translation of Section V.

* cited by examiner

TEST APPARATUS AND TEST METHOD

CROSS REFERENCE TO RELATED APPLICATION

This is a continuation application of PCT/JP2008/052377 filed on 13 Feb. 2008 which claims priority from a Japanese Patent Application No. 2007-036361 filed on 16 Feb. 2007, the contents of which are incorporated herein by reference.

BACKGROUND

1. Technical Field

The present invention relates to a test apparatus and a test method. In particular, the present invention relates to a test apparatus and a test method for testing a memory under test that stores data in block-units.

2. Related Art

Recently, the demand for non-volatile memories such as NAND flash memories has increased greatly. The memory blocks in such non-volatile memories have a prescribed rate of defect occurrence, such as 2%, for example. Therefore, in the design phase, the memory is provided with backup blocks in addition to a number of blocks corresponding to the set storage capacity. A test apparatus judges the acceptability of each block during manufacturing and writes, to the memory, information for disabling blocks in which a defect occurs. In this way, even a memory having up to a certain amount of defects can be treated as an acceptable memory operating correctly.

Japanese Application Publication No. 2007-12221 discloses a test apparatus for testing a flash memory or the like that uses an algorithmic pattern generator (ALPG).

A conventional test apparatus uses a bad block memory to manage information concerning which blocks have defects. The bad block memory stores data in a bit map format, and stores, in addresses having the same addresses of the blocks of the memory under test, logic values of 0 or 1 indicating whether the corresponding block is operating correctly. In order to disable a block in which a defect occurs, it is necessary for the test apparatus to supply the memory under test with the address of the block to be disabled. Therefore, in order for the test apparatus to disable a block, the bad block memory must be scanned after the test is completed, and then the test apparatus must acquire the necessary address values and accumulate these values in another storage region, and then supply the memory under test with these address values accumulated after the scanning. Such a process takes a long time, and takes an even longer time when a plurality of devices are tested in parallel because the number of steps in the after-processing increases.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may include a test apparatus that tests a plurality of memories under test storing data in block-units, comprising an address generating section that is provided in common to the plurality of memories under test, and that sequentially generates addresses to be tested in the memories under test; a plurality of buffer memories that are provided to correspond respectively to the plurality of memories under test, and that each store addresses to be independently supplied to the corresponding memory under test; a reading section that outputs, to each of the plurality of memories under test, a read command for reading block data stored at each address generated by the address generating section; a plurality of comparing sections that are provided to correspond respectively to the plurality of memories under test, and that each compare (i) the block data output by the corresponding memory under test in response to the read command to (ii) an expected value of this block data, for each address generated by the address generating section; a plurality of bad block storage control sections that are provided to correspond respectively to the plurality of memories under test, and that each sequentially store, in the buffer memory provided to the corresponding memory under test and in response to the comparing section detecting a discrepancy in the comparison, the address generated by the address generating section for reading the block data; and a disabling section that outputs, in parallel to the plurality of memories under test, a disable command for writing disable data that disables blocks corresponding to the addressees stored in the buffer memories, these addresses being included in the disable command as an individual addresses.

The test apparatus may further comprise a buffer section that buffers addresses generated by the address generating section and sequentially updates the buffered addresses each time the address generated by the address generating section changes. The address generating section may supply the buffer section with an address corresponding to a read command from when the read command is output to when a subsequent read command is output, and each bad block storage control section, in response to the corresponding comparing section detecting a discrepancy in the comparison, may read the address from the buffer section and sequentially stores this address in the buffer memory provided to the corresponding memory under test.

Each bad block storage control section may include a storage processing section that, in response to output of the read command, sequentially stores the addresses generated by the address generating section in the buffer memory; and an address control section that stores an address pointer indicating an address in the buffer memory to which the storage processing section is to store the address, and that increments a value of the stored address pointer in response to the comparing section detecting a discrepancy in the comparison.

Addresses input to the memories under test may be obtained by converting the addresses generated by the address generating section into a format for input to the memories under test, each bad block storage control section, in response to the corresponding comparing section detecting a discrepancy in the comparison, may sequentially store the addresses generated by the address generating section in the corresponding buffer memory, in an original format of the addresses before conversion to the format for input to the memories under test. The test apparatus may further comprise a converting section that reads the addresses stored in the buffer memories and converts these addresses into the format for input to the memories under test. The disabling section may instruct the converting section to convert the addresses and outputs the disable command for writing disable data that disables blocks corresponding to the converted addresses included in the disable command as individual address.

According to a second aspect of the present invention, provided is a method for testing a plurality of memories under test storing data in block-units with a test apparatus, wherein the test apparatus includes an address generating section that is provided in common to the plurality of memories under test, and that sequentially generates addresses to be tested in the memories under test and a plurality of buffer memories that are provided to correspond respectively to the plurality of memories under test, and that each store addresses to be independently supplied to the corresponding memory under test. The test method comprises outputting, to each of the plurality of memories under test, a read command for reading block data stored at each address generated by the address generating section; for each of the plurality of memories under test, repeatedly comparing (i) the block data output by the memory under test in response to the read command to (ii) an expected value of this block data, for each address generated by the address generating section; for each of the plurality of memories under test, sequentially storing, in the buffer memory provided to the memory under test and in response to a discrepancy being detected in the comparison, the address generated by the address generating section for reading the block data; and outputting, in parallel to the plurality of memories under test, a disable command for writing disable data that disables blocks corresponding to the addressees stored in the buffer memories, these addresses being included in the disable command as individual addresses.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
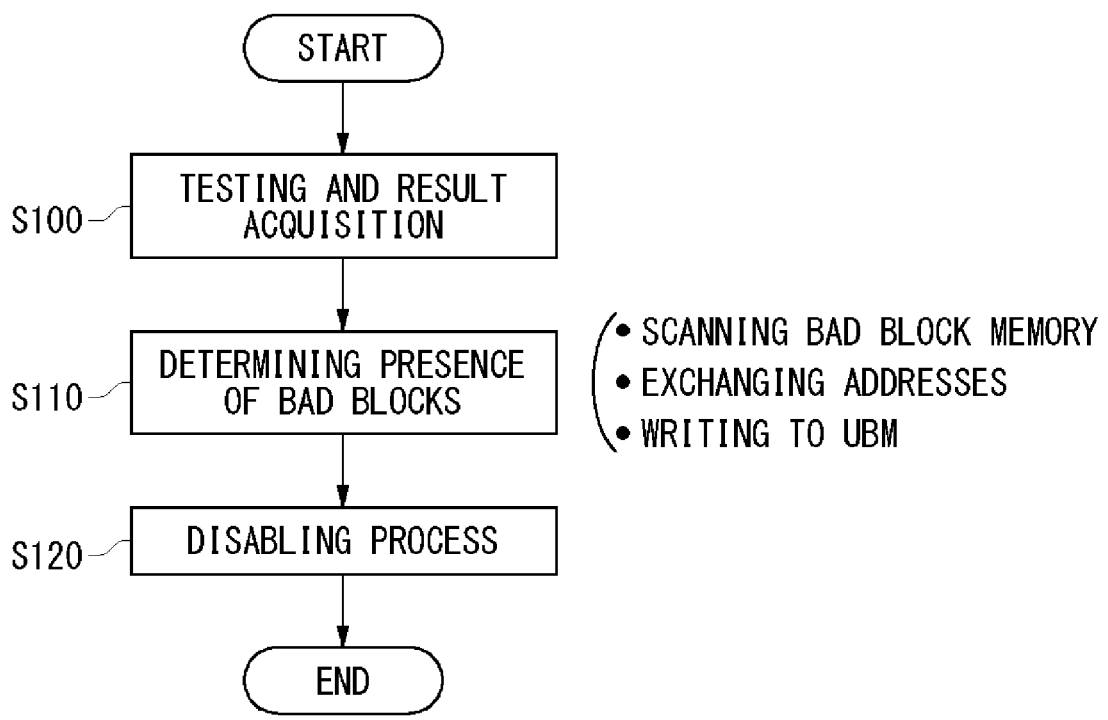
FIG. 1 shows a flow chart of a test process for judging acceptability of a device under test.

FIG. 1 shows a flow chart of a test process for judging acceptability of a device under test. A test apparatus 20 judges the acceptability of a memory under test 100 storing data in block-units, and acquires a judgment result for each block (S100). The acceptability judgment result may be acquired as data in a bit map format in a bad block memory. The bad block memory stores a logic value of 1 at addresses matching addresses of the blocks exhibiting defects, and stores a logic value of 0 at addresses matching addresses of the blocks that do not exhibit defects. After acquiring the judgment results, the test apparatus 20 performs a process based on the data in the bad block memory (S110). More specifically, the test apparatus 20 scans the bad block memory to detect logic values of 1. The value of each address at which a logic value of 1 is detected is then converted into a format for input to an I/O terminal of the memory under test 100. The test apparatus 20 then records the converted address values in a buffer memory (S110). Next, the test apparatus 20 sequentially reads the addresses recorded in the buffer memory, and outputs, to the 100, a disable command for disabling a block corresponding to an address whose value is also included in the disable command (S120). The buffer memory may include a universal buffer memory.

The device under test is not limited to the memory under test 100, and may instead be a processor or semiconductor apparatus including a memory region. Therefore, the present invention is also applicable to a processor or semiconductor apparatus including a memory region.

Figure 2:
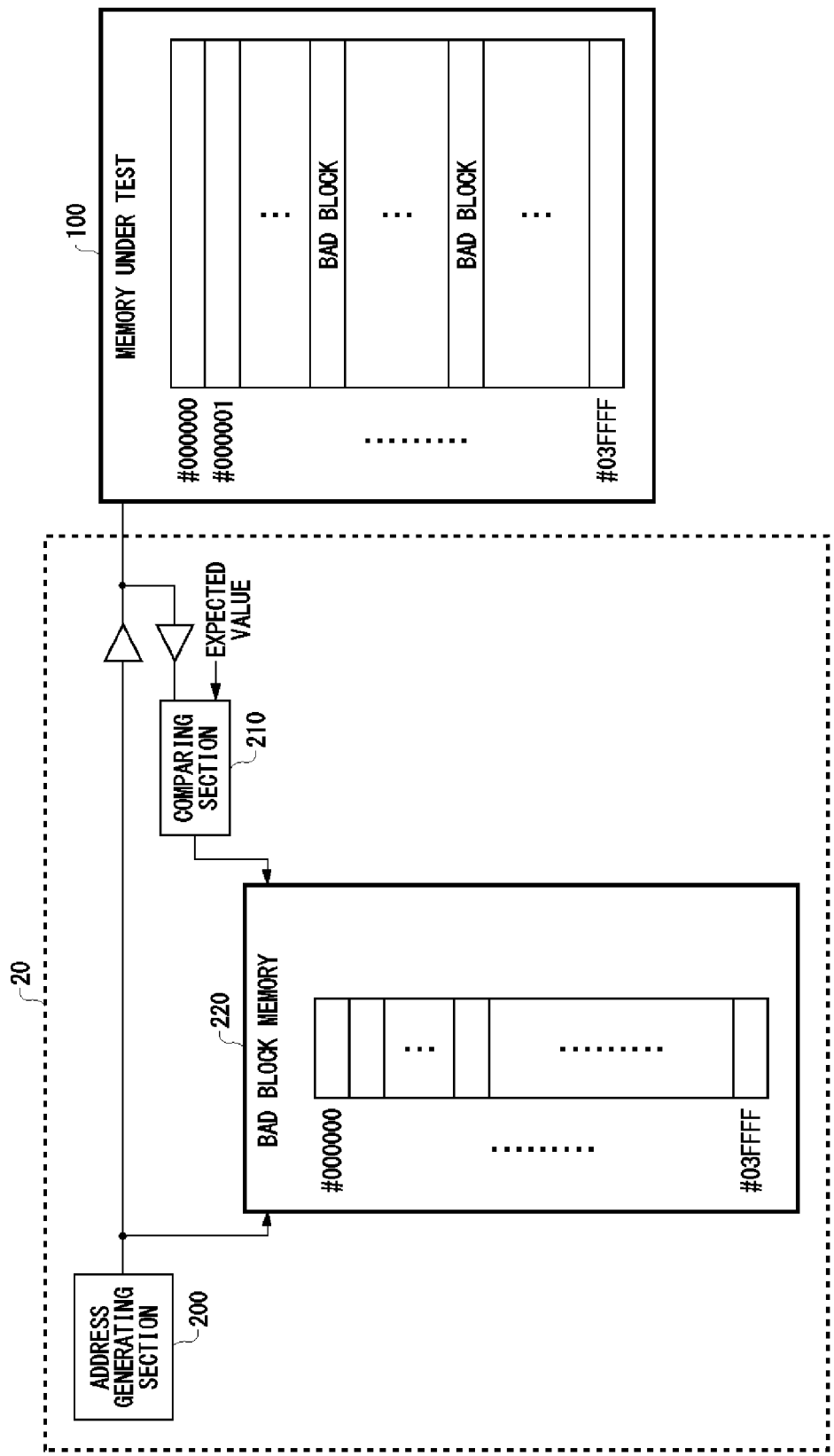
FIG. 2 shows a functional configuration of the test apparatus 20 relating to a process for acquiring the test results.

FIG. 2 shows a functional configuration of the test apparatus 20 relating to a process for acquiring the test results. The test apparatus 20 includes an address generating section 200, a comparing section 210, and a bad block memory 220. The test apparatus 20 aims to judge acceptability of block-units in the memory under test 100. The address generating section 200 sequentially generates addresses of test targets in the memory under test 100. For example, a storage location in the memory under test 100 can be designated by a combination of a row address and a column address, and the address generating section 200 supplies the memory under test 100 with such combinations of a row address and a column address. FIG. 2 shows row addresses. For a given row address, the address generating section 200 may sequentially output, to the memory under test 100, the values from address #000001 to address #03FFFF, for example.

The comparing section 210 sequentially compares, for each address generated by the address generating section 200, (i) block data output by the memory under test 100 in response to a read command and (ii) an expected value for that block data. If the comparison indicates a match, the comparing section 210 outputs a logic value of 0 to the bad block memory 220, if the comparison indicates a difference, the comparing section 210 outputs a logic value of 1 to the bad block memory 220. The bad block memory 220 records the logic values output by the comparing section 210 indicating the acceptability of each block at the addresses output by the address generating section 200. In this way, logic values indicating whether each block contains a defect are recorded in the bad block memory 220.

Figure 3A:
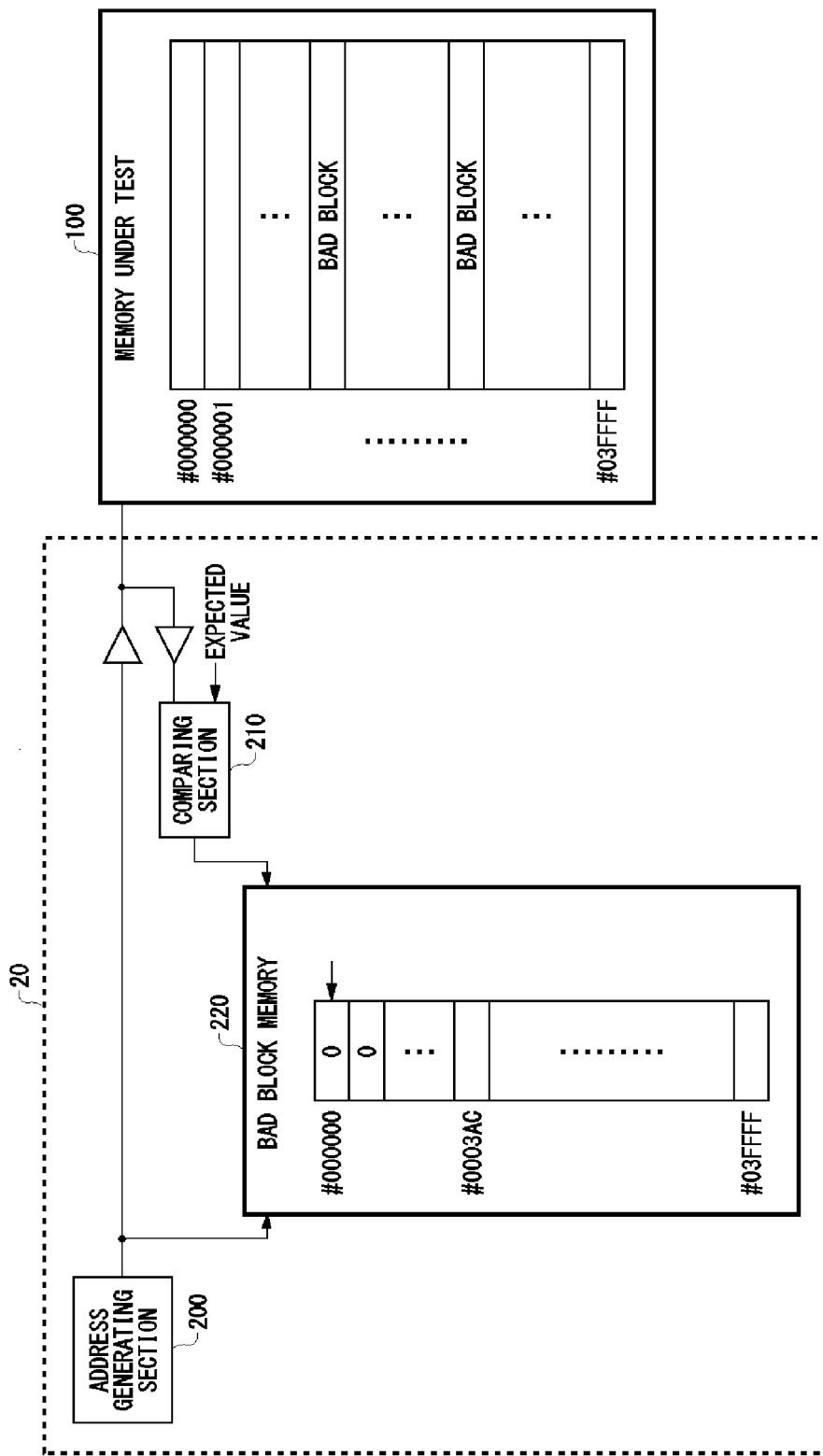
FIG. 3A shows a state of the test apparatus 20 when test result acquisition begins.

FIG. 3A shows a state of the test apparatus 20 when test result acquisition begins. At this time, the acceptability judgment is made for the block located at address #000000. This block is operating correctly, and therefore the comparing section 210 outputs a logic value of 0. As a result, the bad block memory 220 records a logic value of 0 at address #000000 output from the address generating section 200. The address value is sequentially incremented such that each block in the memory under test 100 sequentially becomes a test target, beginning with the leading block.

Figure 3B:
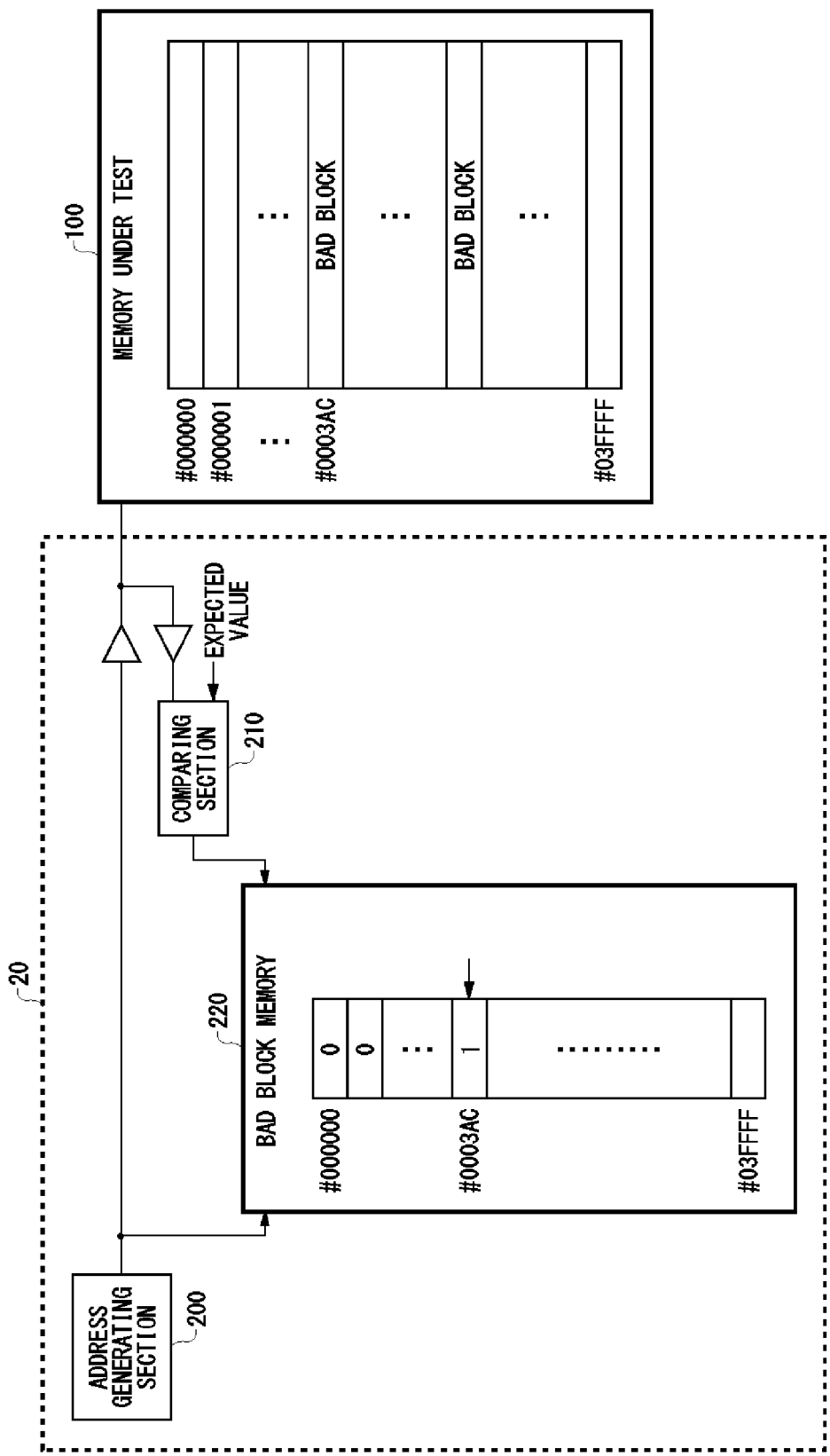
FIG. 3B shows a state of the test apparatus 20 at a first point in time in the midst of test result acquisition.

FIG. 3B shows a state of the test apparatus 20 at a first point in time in the midst of test result acquisition. At this time, the acceptability judgment is made for the block located at address #0003AC. This block has a defect, and therefore the comparing section 210 determines that the block data read from this block differs from the expected value. As a result, the comparing section 210 outputs a logic value of 1, indicating the presence of a defect. The bad block memory 220 records the logic value of 1 output by the comparing section 210 at address #0003AC output from the address generating section 200.

Figure 3C:
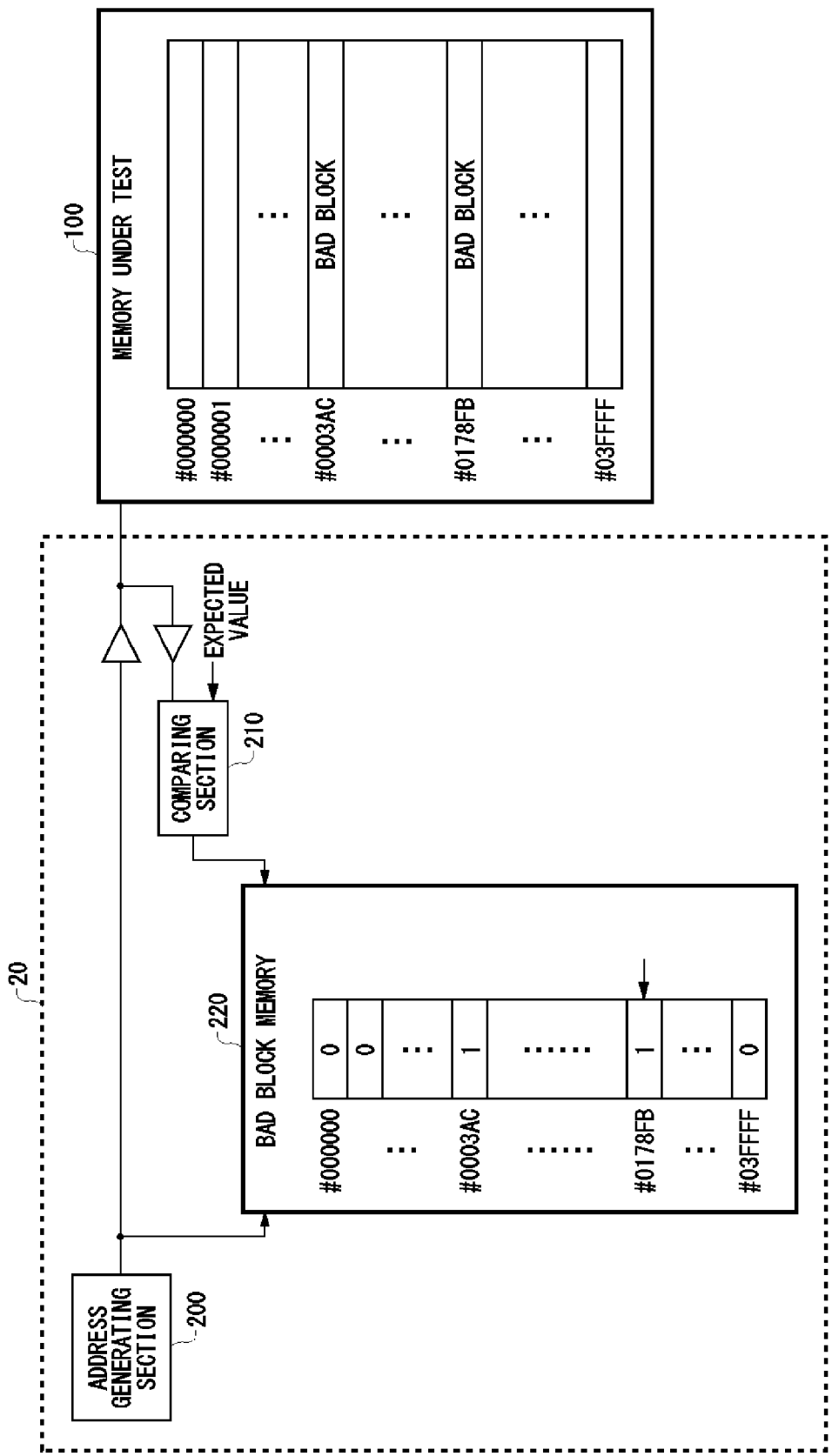
FIG. 3C shows a state of the test apparatus 20 at a second point in time in the midst of test result acquisition.

FIG. 3C shows a state of the test apparatus 20 at a second point in time in the midst of test result acquisition. At this time, the acceptability judgment is made for the block located at address #0178FB. This block has a defect, and therefore the comparing section 210 determines that the block data read from this block differs from the expected value. As a result, the comparing section 210 outputs a logic value of 1, indicating the presence of a defect. The bad block memory 220 records the logic value of 1 output by the comparing section 210 at address #0178FB output from the address generating section 200.

By repeating the above processes, the bad block memory 220 records logic value data indicating whether there is a defect in each of the blocks of the memory under test 100.

The resulting logic value data in a bit map format can be used by a conventional test apparatus for various purposes. For example, when performing a prescribed test on a plurality of blocks while exempting blocks judged to have a defect from the test, bad block memory 220 can be accessed according to the addresses generated by the address generating section 200 in order to easily judge whether a block at a given address is defective and should be exempt. By using the bad block memory 220 in this way, even when testing is desired for acceptable blocks only, the test apparatus 20 can be easily configured to by simplifying the circuit configuration between the address generating section 200 and the memory under test 100.

Next, the test apparatus 20 performs a process to disable blocks having defects, based on the data recorded in the bad block memory 220. For this process, address data for the blocks having defects is necessary. In order to obtain such data, it is inefficient to use the data configuration of the bad block memory 220 as is. Therefore, the test apparatus 20 performs a process to generate the necessary address data and store this data in a different storage region. This process is described with reference to FIGS. 4A and 4B. This process corresponds to the process of S110 described above.

Figure 4A:
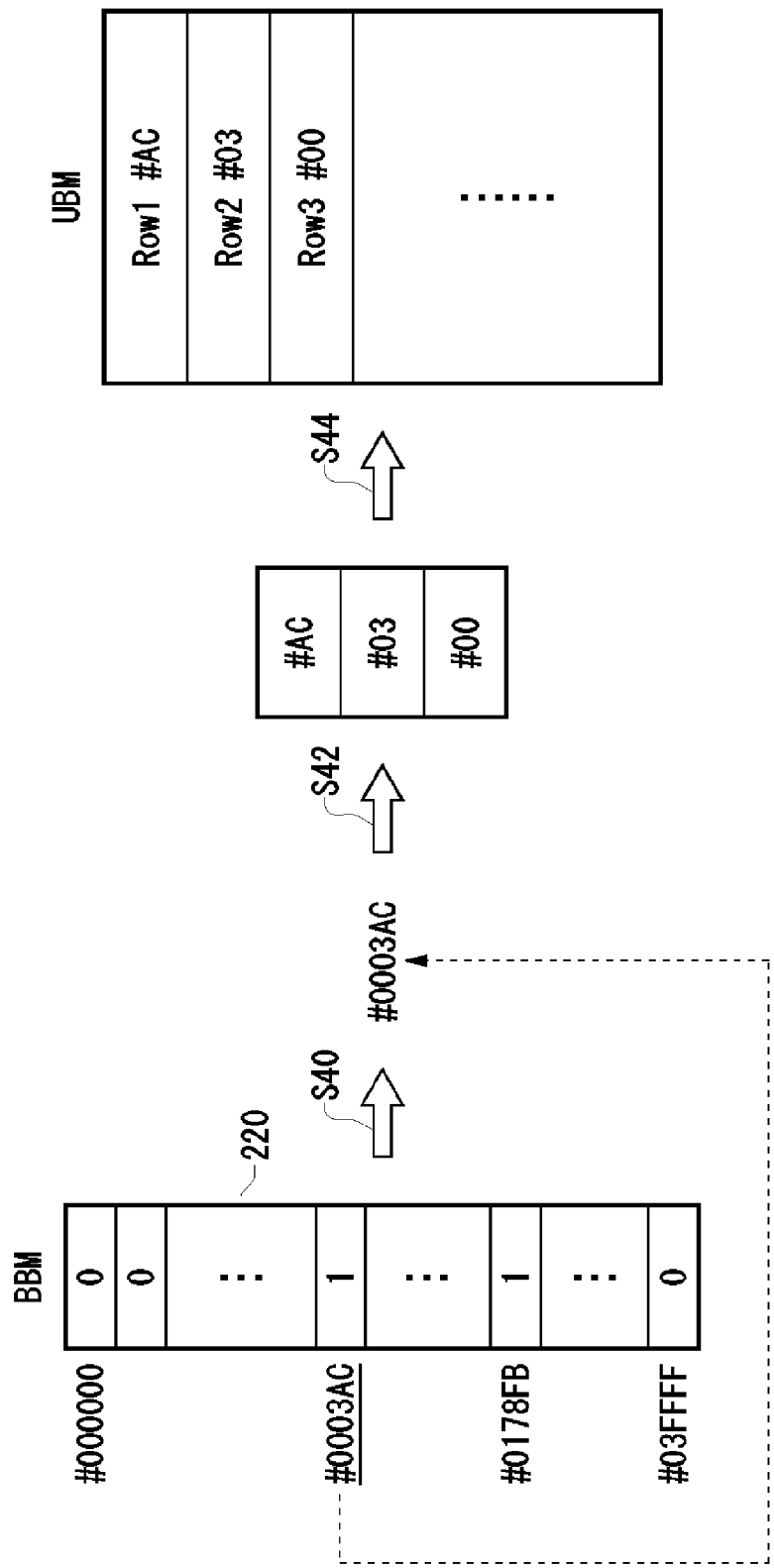
FIG. 4A shows a first stage of an address exchange process.

FIG. 4A shows a first stage of an address exchange process. First, the test apparatus 20 scans the bad block memory 220 to detect an address at which a logic value of 1 is recorded. As a result, in this example, the test apparatus 20 detects address #0003AC (S40). The test apparatus 20 then converts this address into a format for input to the memory under test 100 (S42). For example, in order to access the memory under test 100, it is necessary to input, to the memory under test 100, a read or write command associated with the address to be accessed. The format of the address and the input command may be determined according to the specifications of the memory under test 100. Accordingly, the test apparatus 20 must convert the address detected in the bad block memory 220 into a format according to these specifications. For example, as shown in FIG. 4A, the address is divided into three 8-bit pieces of data, #AC, #03, and #00 as a result of the conversion. The test apparatus 20 then stores the converted address in the buffer memory (S44).

Figure 4B:
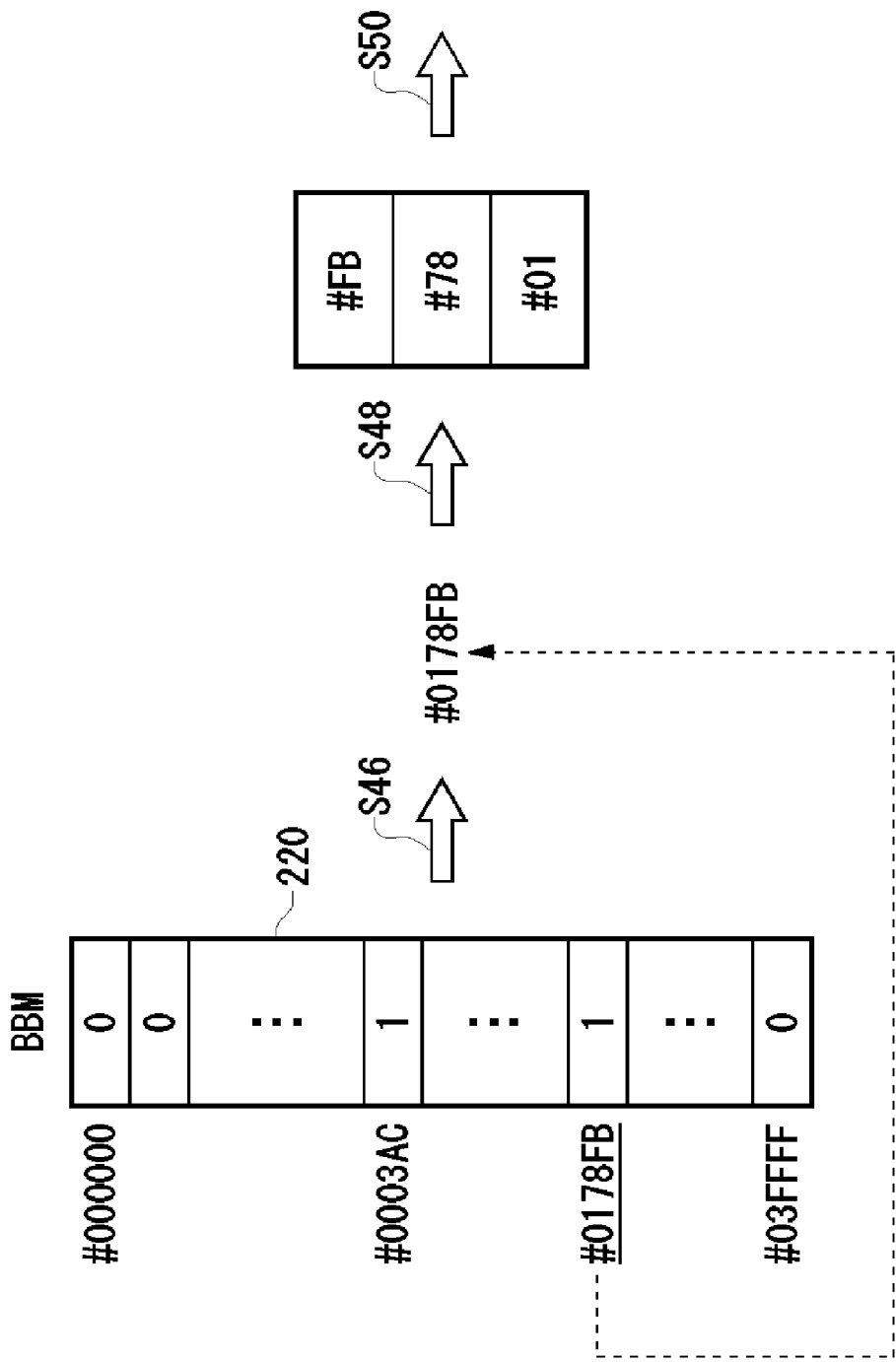
FIG. 4B shows a second stage of the address exchange process.

FIG. 4B shows a second stage of the address exchange process. Here, the test apparatus 20 scans the bad block memory 220 to detect the next address at which a logic value of 1 is recorded. As a result, in this example, the test apparatus 20 detects address #0178FB (S46). In the same manner as described above, the test apparatus 20 converts this address into three pieces of data, #FB, #78, and #01 (S48). The test apparatus 20 then stores the converted address data in the buffer memory at the address following the address used in S44 (S50).

Figure 5A:
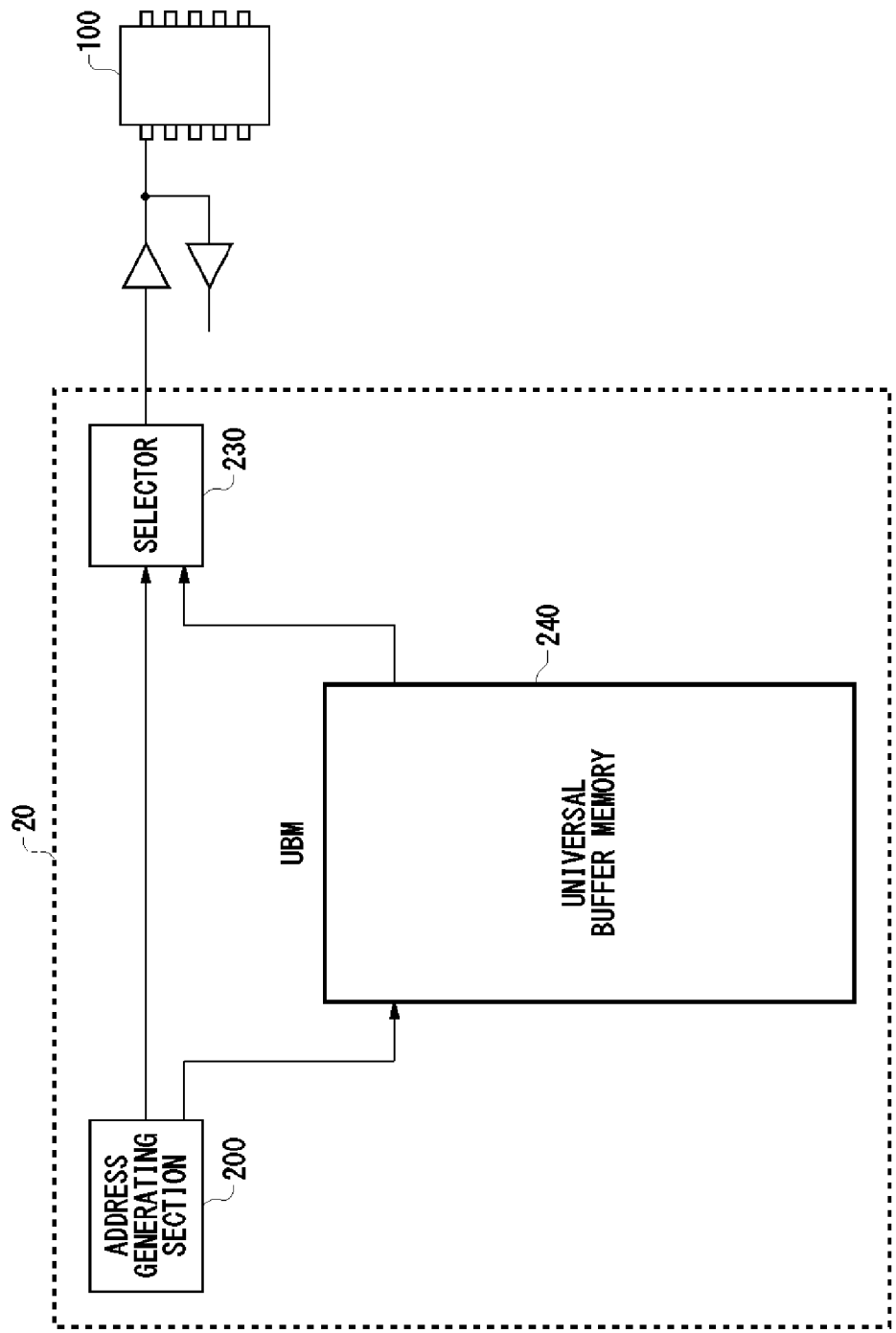
FIG. 5A shows a functional configuration of the test apparatus 20 relating to the disable process.

FIG. 5A shows a functional configuration of the test apparatus 20 relating to the disable process. The test apparatus 20 includes the address generating section 200, a selector 230, and a universal buffer memory 240 for achieving the disable process. The universal buffer memory 240 stores the address data described in relation to FIGS. 4A and 4B. The address generating section 200 generates addresses for sequentially reading address data from the universal buffer memory 240, and outputs these addresses to the universal buffer memory 240. This process corresponds to the process of S120 described above. The universal buffer memory 240 outputs, to the selector 230, address data corresponding to the addresses output from the address generating section 200. The selector 230 selects address data output from the universal buffer memory 240, and outputs, to the memory under test 100, a disable command including this address data.

Figure 5B:
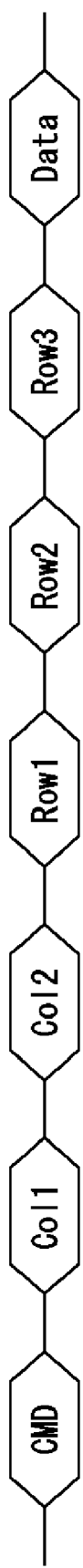
FIG. 5B shows an exemplary command output from the test apparatus 20 to the memory under test 100.

FIG. 5B shows an exemplary command output from the test apparatus 20 to the memory under test 100. For certain memory under test 100 specifications, it is necessary to supply the address data in pieces of 8-bit data associated with the read or write command (CMD). More specifically, as shown in FIG. 5B, the data output to the memory under test 100 includes a sequence beginning with a command (CMD), and sequentially followed by data (Col1) made up of the first half of the bits in the column address, data (Col2) made up of the second half of the bits in the column address, data (Row1) made up of the first third of the bits in the row address, data (Row2) made up of the second third of the bits in the row address, and data (Row3) made up of the final third of the bits in the row address. In the case of a write command, the sequence further includes data (Data) to be written. The disable command orders a prescribed process for designating addresses having a defect, and therefore it is necessary that the disable command include address designation that corresponds to the specifications of the memory under test 100. Therefore, the universal buffer memory 240 records the address data in a format corresponding to the specifications of the command.

Figure 6A:
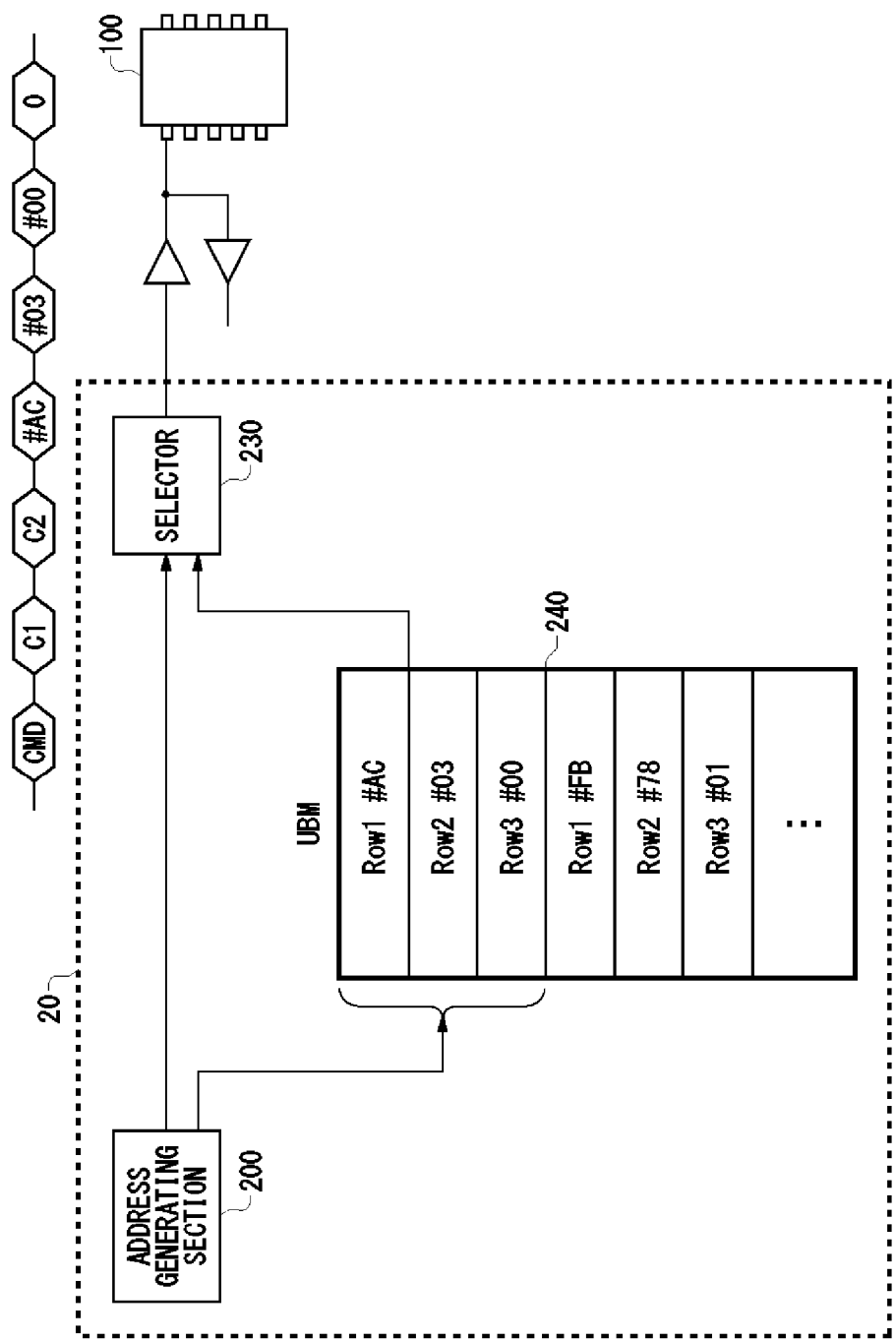
FIG. 6A shows a state of the test apparatus 20 when the disable process begins.

FIG. 6A shows a state of the test apparatus 20 when the disable process begins. At this time, the address data recorded in the universal buffer memory 240 has yet to be supplied to the memory under test 100. The address generating section 200 outputs, to the universal buffer memory 240, sequential address values in an order beginning with the leading address in the universal buffer memory 240. The universal buffer memory 240 outputs, to the selector 230, the data recorded at the addresses output by the address generating section 200. As a result, the value #AC corresponding to the first third of the row address, the value #03 corresponding to the second third of the row address, and value #00 corresponding to the final third of the row address are read in the stated order, and are supplied to the memory under test 100 in place of the address values supplied from the address generating section 200. For example, this address data may be sequentially output following the command, the first half of the column address, and the second half of the column address. In one cycle of the disable process, data 0 may be recorded for a bad block of the memory under test 100.

Figure 6B:
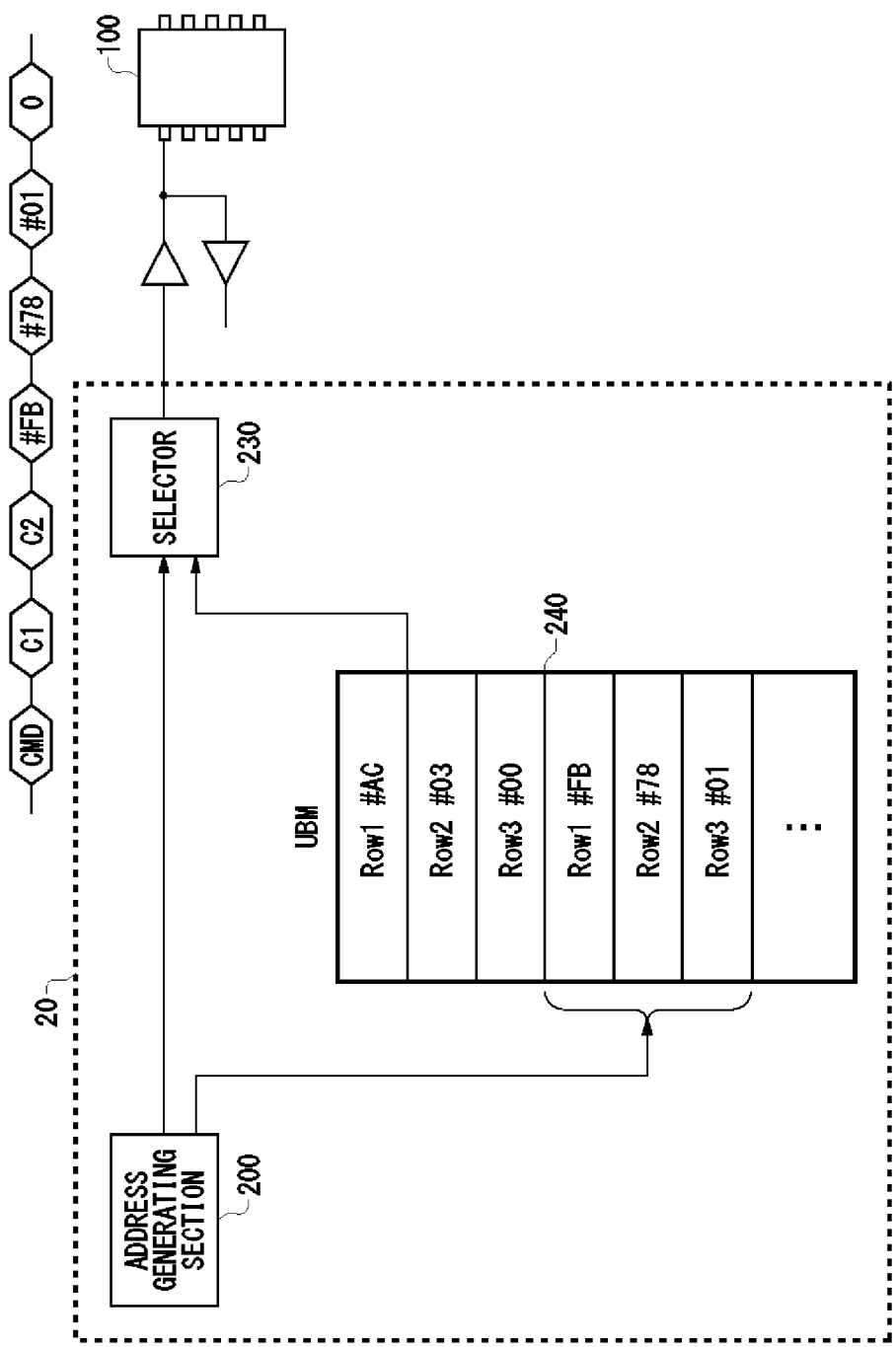
FIG. 6B shows a state of the test apparatus 20 in the midst of the disable process.

FIG. 6B shows a state of the test apparatus 20 in the midst of the disable process. At this time, data 0 has already been written for address #0003AC, and so the disable process is completed for this address. Next, the address generating section 200 increments the address value supplied to the universal buffer memory 240 to read the next address after address #0003AC. As a result, the universal buffer memory 240 sequentially outputs the value #FB corresponding to the first third of the row address, the value #78 corresponding to the second third of the row address, and value #01 corresponding to the final third of the row address are read in the stated order. In this way, the address data is input to the memory under test 100 following the command, the first half of the column address, and the second half of the column address.

In the configurations described in relation to FIGS. 1 to 6, the appropriate defective blocks in the memory under test 100 can be disabled based on the results of acceptability judgments for each of the blocks in the memory under test 100. However, these configurations are inefficient because they require a conversion process to generate the address data from the data recorded in the bad block memory 220. In particular, if the memory under test 100 includes a large number of defective blocks, sequential processing is necessary, which further lowers the efficiency. To solve this problem, a test apparatus 70 described hereinafter in relation to FIGS. 7 to 11 can shorten the overall testing time by increasing the efficiency of the conversion process. The following is a detailed description of the test apparatus 70.

Figure 7:
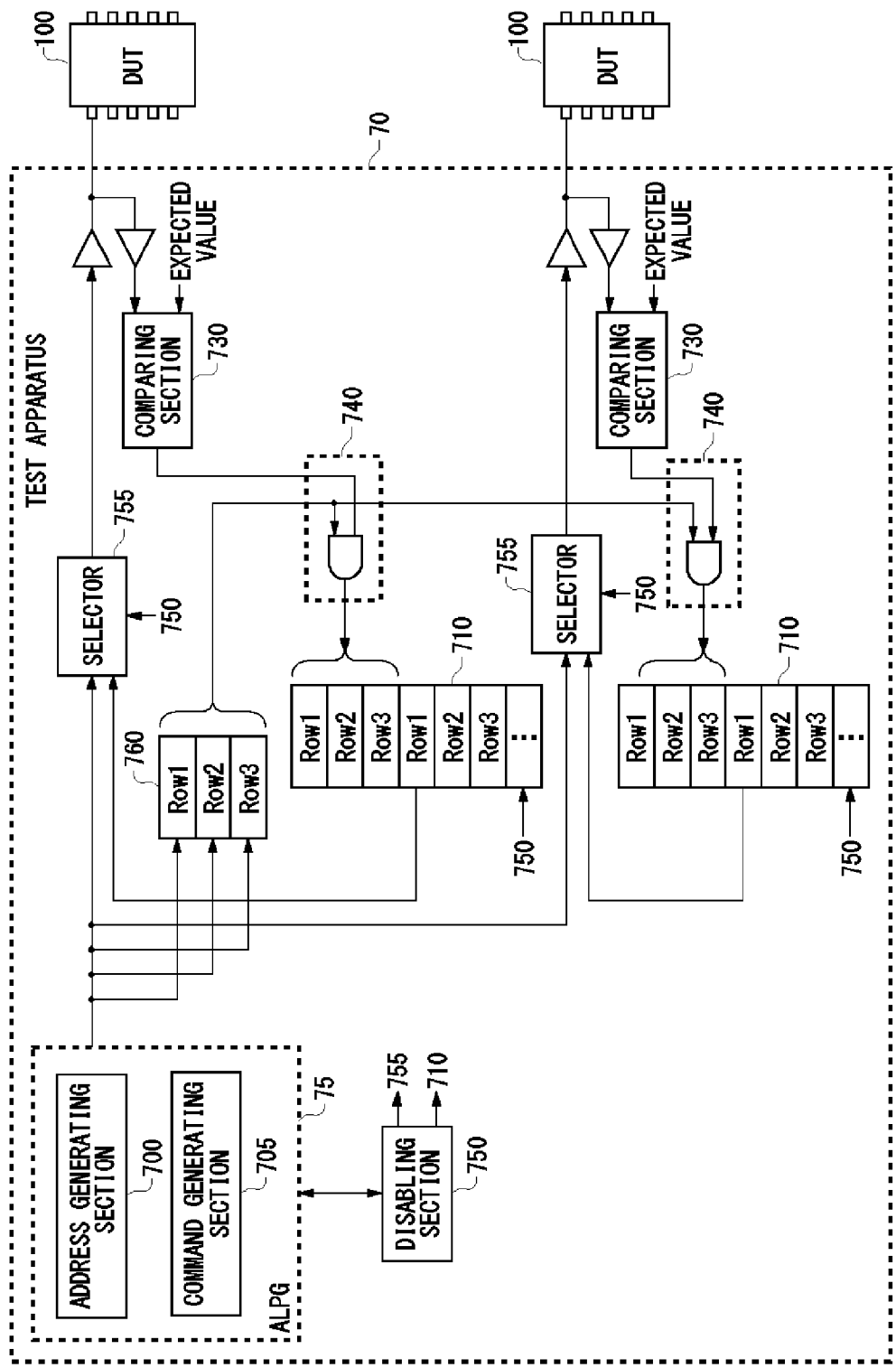
FIG. 7 shows an overall configuration of the test apparatus 70 according to an embodiment of the present invention.

FIG. 7 shows an overall configuration of the test apparatus 70 according to an embodiment of the present invention. The test apparatus 70 seeks to test, in parallel, a plurality of memories under test 100 storing data in block-units. The test apparatus 70 includes an ALPG 75 provided in common to the plurality of memories under test 100, a plurality of universal buffer memories 710 provided to correspond respectively to the plurality of memories under test 100, a plurality of comparing sections 730 provided to correspond respectively to the plurality of memories under test 100, a plurality of bad block storage control sections 740 provided to correspond respectively to the plurality of memories under test 100, a disabling section 750 provided in common to the plurality of memories under test 100, and a buffer section 760 provided in common to the plurality of memories under test 100.

The ALPG 75 is a type of computational processing device, and sequentially outputs sets of a command and an address by executing a program based on a prescribed algorithm. More specifically, the ALPG 75 includes an address generating section 700 and a command generating section 705, which is an example of the reading section in the present invention. The address generating section 700 sequentially generates addresses of test targets in the memory under test 100 to be supplied in common to the plurality of memories under test 100. The format of the addresses generated by the address generating section 700 is not the format for input to the memory under test 100 described above, and may instead be an independent format according to the specifications of the address generating section 700. The generated addresses are converted into the format for input to the memory under test 100, and are then output via a signal transmission line to the memory under test 100.

The plurality of universal buffer memories 710 each store addresses to be supplied individually to the corresponding memory under test 100. The command generating section 705 outputs, to the plurality of memories under test 100, read commands for reading block data stored at the addresses generated by the address generating section 700. Each of the plurality of comparing sections 730 acquires, via a comparator circuit, the block data output by the corresponding memory under test 100 according to the read command, for each of the addresses generated by the address generating section 700. Each comparing section 730 then compares the acquired block data to the expected value of the block data. The expected value is the value of block data written to each address in advance, and if the read block data matches this expected value, the reading of that block is judged to be successful.

The buffer section 760 buffers the addresses generated by the address generating section 700 and sequentially changes the buffered addresses each time the address generated by the address generating section 700 changes. The format of the buffered addresses is not the independent format output by the buffer section 760, and is instead the format converted for input to the memory under test 100. The address generating section 700 continues supplying the buffer section 760 with an address corresponding to a read command output by the command generating section 705 until the command generating section 705 outputs the next command. When one of the comparing sections 730 detects a discrepancy, the corresponding bad block storage control section 740 sequentially stores, in the universal buffer memory 710 provided to the corresponding memory under test 100, the address generated by the address generating section 700 for reading the block data in which the discrepancy is detected. More specifically, each bad block storage control section 740, in response to the corresponding comparing section 730 detecting a discrepancy, reads the address from the buffer section 760 and stores this address in the universal buffer memory 710 of the corresponding memory under test 100.

As a specific configurational example, each bad block storage control section 740 includes an AND gate. Each AND gate receives (i) the address data output by the address generating section 700 and stored in the buffer section 760 and (ii) a logic value output by the corresponding comparing section 730 that indicates whether the block data matches the expected value. Each AND gate supplies the corresponding universal buffer memory 710 with the address data on a condition that the block data does not match the expected value. Upon receiving the address data, each universal buffer memory 710 stores the received address data.

Each selector 755 selects the addresses output by the address generating section 700 until the disabling section 750 begins the disable process, and outputs the selected addresses to the corresponding memory under test 100 via a driver circuit. Furthermore, after the disabling section 750 begins the disable process, each selector 755 selects the addresses output by the corresponding universal buffer memory 710 and outputs the selected addresses to the corresponding memory under test 100 via the driver circuit.

After the acceptability judgment is made for all of the blocks, the disabling section 750 receives instructions from the address generating section 700 and begins the disable process, for example. More specifically, the disabling section 750 outputs, in parallel to the plurality of memories under test 100, the disable command that writes disable data for disabling blocks corresponding to the addresses written in the universal buffer memories 710, which are also included in the disable command as individual addresses. The output of the addresses to be disabled is achieved by sequentially supplying a plurality of addresses to the universal buffer memory 710 in order, beginning with a leading address, thereby causing the universal buffer memory 710 to sequentially output the addresses of the defective blocks. The output of the disable command including these addresses is achieved by switching the output of the selection target addresses designated by the selector 755 from the address generating section 700 to the universal buffer memory 710.

Figure 8A:
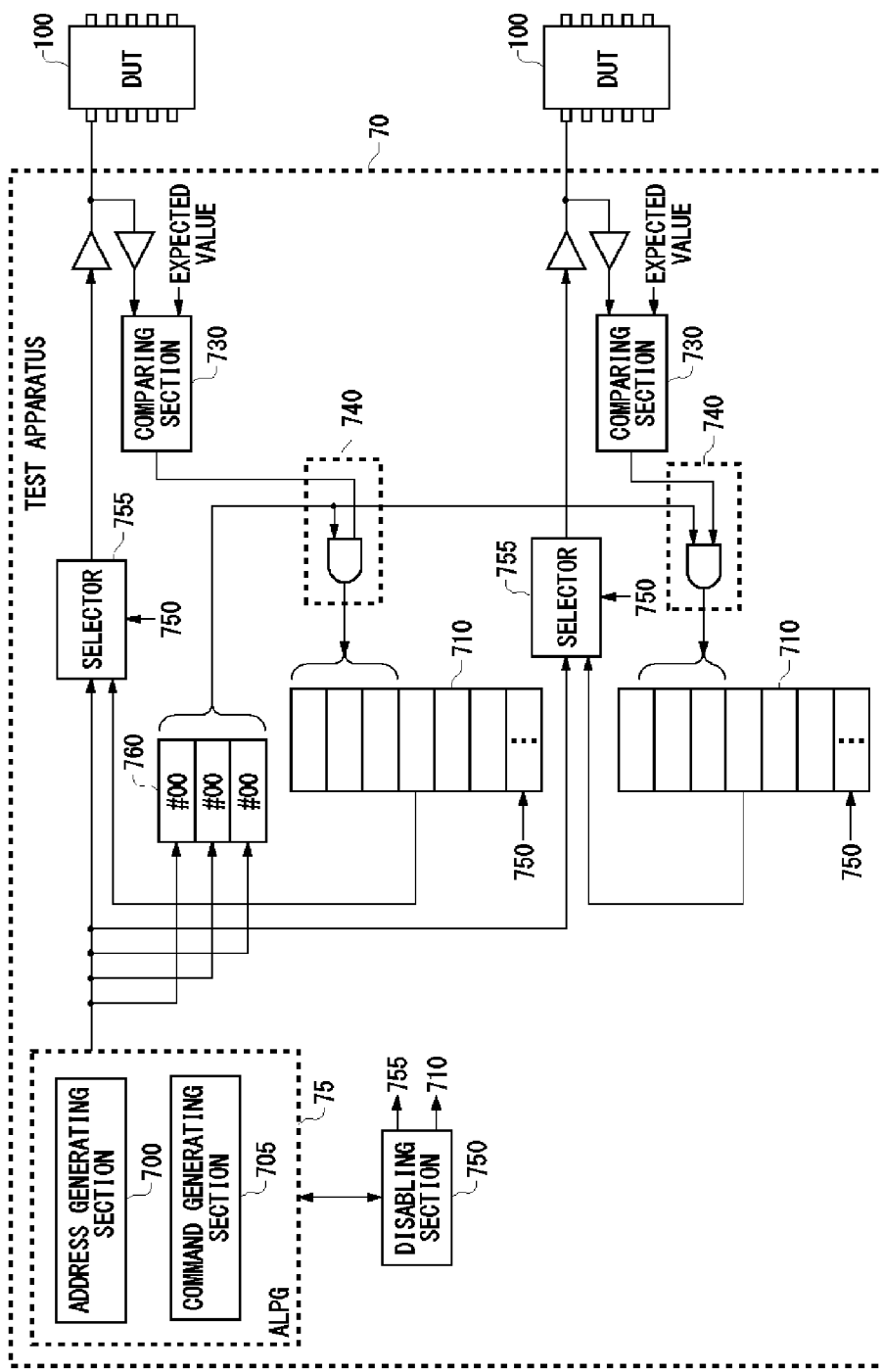
FIG. 8A shows a state of the test apparatus 70 when the test result acquisition is begun.

FIG. 8A shows a state of the test apparatus 70 when the test result acquisition begins. At the start of the acquisition process, no defective blocks are detected yet. Therefore, none of the universal buffer memories 710 store any addresses of defective blocks. Since the judgment concerning block acceptability begins with the leading block, the address generating section 700 may output address #000000 indicating the leading block. As a result, the buffer section 760 stores three pieces of data, #00, #00, and #00 obtained by dividing address #000000 into three pieces.

Figure 8B:
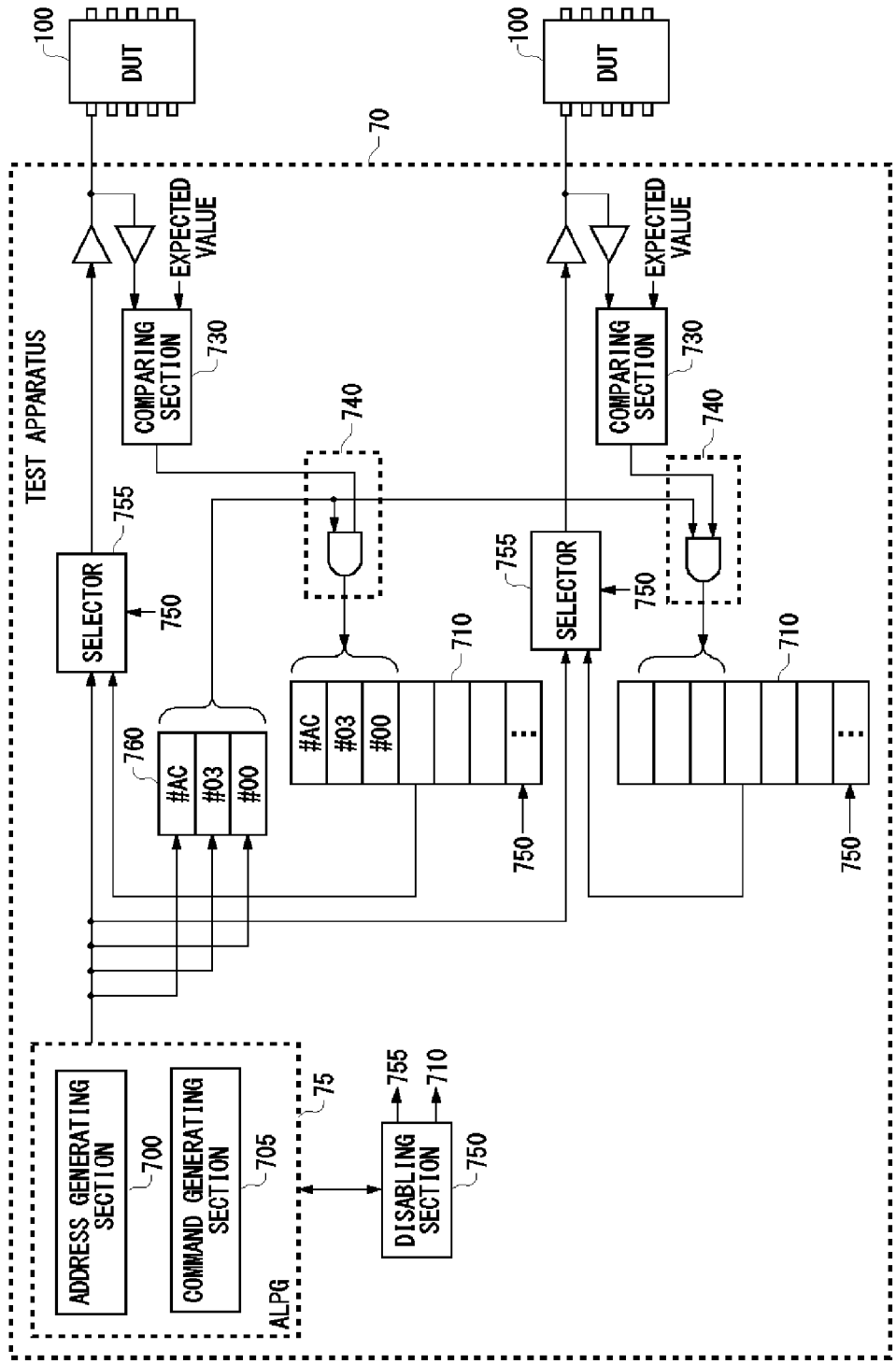
FIG. 8B shows a state of the test apparatus 70 at a first point in time in the midst of the test result acquisition process.

FIG. 8B shows a state of the test apparatus 70 at a first point in time in the midst of the test result acquisition process. At this time, the address generating section 700 outputs address #0003AC. Therefore, the buffer section 760 sequentially stores #AC, #03, and #00 obtained by dividing address #0003AC into three pieces. A defect occurs in the reading and writing for the block at this address. Therefore, the comparison result of the comparing section 730 indicates a discrepancy with respect the expected value. The bad block storage control section 740 supplies the universal buffer memory 710 with the address read from the buffer section 760 based on the logic value received from the comparing section 730. The universal buffer memory 710 stores the address supplied thereto. As a result, #AC, #03, and #00 obtained by dividing address #0003AC into three pieces are stored in the universal buffer memory 710 in the stated order.

Figure 8C:
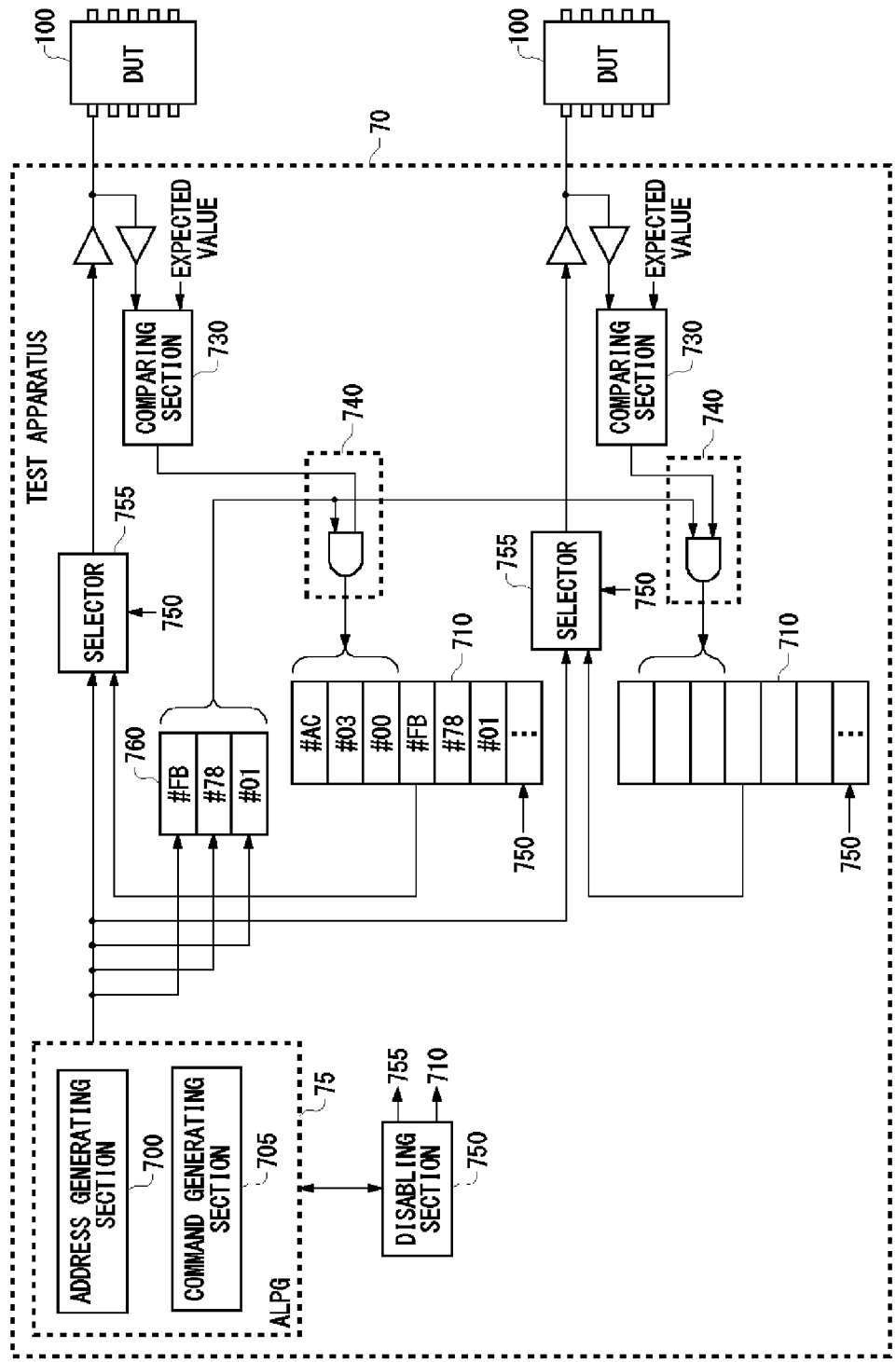
FIG. 8C shows a state of the test apparatus 70 at a second point in time in the midst of the test result acquisition process.

FIG. 8C shows a state of the test apparatus 70 at a second point in time in the midst of the test result acquisition process. At this time, the address generating section 700 outputs address #0178FB. Therefore, the buffer section 760 sequentially stores #FB, #78, and #01 obtained by dividing address #0178FB into three pieces. A defect occurs in the reading and writing for the block at this address. Therefore, the comparison result of the comparing section 730 indicates a discrepancy with respect to the expected value. The bad block storage control section 740 supplies the universal buffer memory 710 with the address read from the buffer section 760 based on the logic value received from the comparing section 730. The universal buffer memory 710 stores the address supplied thereto. As a result, #FB, #78, and #01 obtained by dividing address #0178FB into three pieces are stored in the universal buffer memory 710 in the stated order.

At both the first and second points in time, a defect occurs in only one of the memories under test 100, and not in the other memory under test 100. Therefore, addresses are stored in only one of the universal buffer memories 710, and the other universal buffer memory 710 does not store any addresses. In this way, by providing each memory under test 100 with a corresponding universal buffer memory 710 and bad block storage control section 740 to control the universal buffer memory 710, a plurality of memories under test 100 can be tested in parallel while the results of the tests are managed independently.

Figure 9:
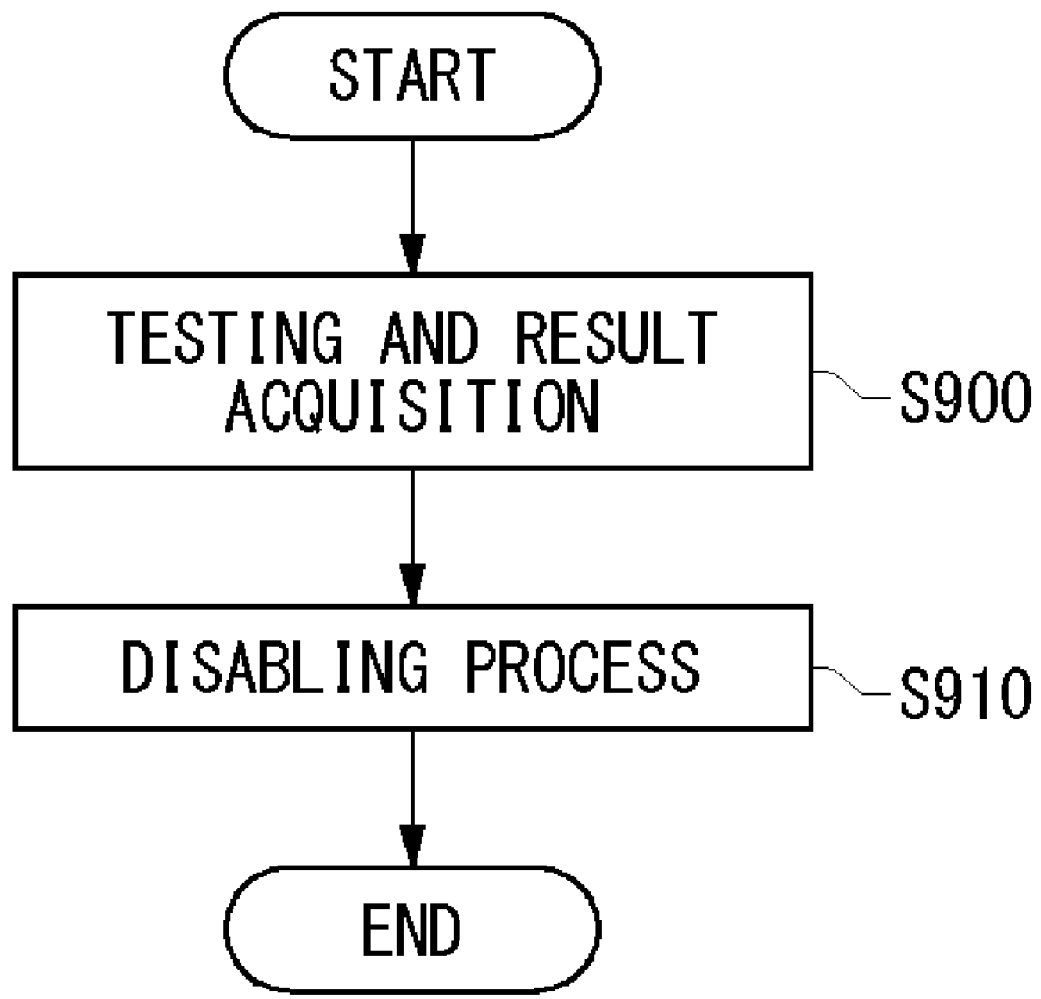
FIG. 9 is a flow chart showing the test process performed by the test apparatus 70 according to an embodiment of the present invention.

FIG. 9 is a flow chart showing the test process performed by the test apparatus 70 according to an embodiment of the present invention. The ALPG 75, the universal buffer memory 710, the comparing section 730, and the bad block storage control section 740 work together to perform the acceptability test on each block of the memory under test 100 and to acquire the test results (S900). More specifically, the address generating section 700 sequentially outputs the address of each block in the address generating section 700. The command generating section 705 outputs a read command to each memory under test 100. The comparing section 730 compares the block data output in response to the read command to the expected data. When a discrepancy is detected between the block data and the expected value, the universal buffer memory 710 stores the corresponding address in a format for input to the memory under test 100.

When the testing and result acquisition is finished, the disabling section 750 performs the process to disable the blocks of the memory under test 100 in which a defect is detected (S910). More specifically, the disabling section 750 supplies each universal buffer memory 710 with sequential addresses, thereby causing each universal buffer memory 710 to output individual addresses to the corresponding memory under test 100. These addresses are selected by the corresponding selector 755, and output to the corresponding memory under test 100 as a portion of the command for disabling the blocks.

As described above in relation to FIGS. 7 to 9, the test apparatus 70 of the present embodiment can perform the acceptability judgment of each block and the process for acquiring addresses of defective blocks in a format for input to the memory under test 100 in parallel during progression of the testing. Furthermore, by providing each memory under test 100 with a corresponding universal buffer memory 710 and bad block storage control section 740 to control the universal buffer memory 710, a plurality of memories under test 100 can be tested in parallel while the results of the tests are managed independently. In this way, the test apparatus 70 can shorten the overall testing time by beginning the disable process for each memory under test 100 immediately after completing the acceptability judgments.

The following describes a modification of the embodiments described above, with reference to FIG. 10. In a first modification, the test apparatus 70 writes the address of a block being tested to the universal buffer memory 710 regardless of whether a defect is present. The test apparatus 70 increments the value of an address pointer, which is supplied to the universal buffer memory 710 to cause the universal buffer memory 710 to store data at a certain address, only when a defect is present. In other words, as long as there are no defects, the address written to in the universal buffer memory 710 is overwritten by the subsequent address. As a result, after testing is finished, only the addresses of the defective blocks are stored in the universal buffer memory 710, with the address stored last removed. In comparison to the embodiment described in FIGS. 7 to 9, the present modification seeks to achieve a test apparatus 70 with a simpler configuration by eliminating the need for the buffer section 760. The following describes a detailed configuration of the test apparatus 70.

Figure 10:
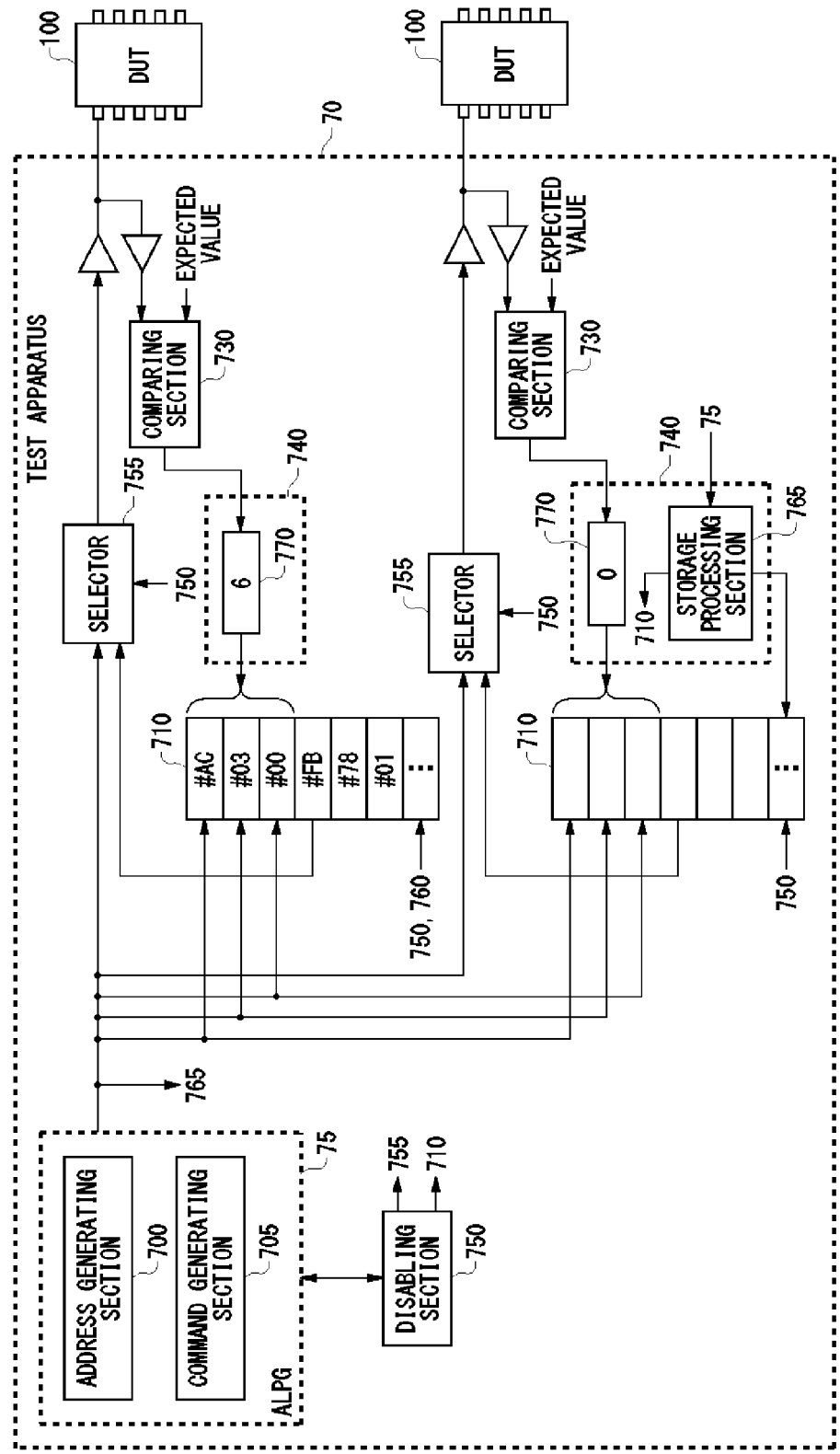
FIG. 10 shows an overall configuration of the test apparatus 70 according to the first modification of the present embodiment.

FIG. 10 shows an overall configuration of the test apparatus 70 according to the first modification of the present embodiment. The test apparatus 70 of the present modification differs from the test apparatus 70 shown in FIG. 7 in that the test apparatus 70 of the present modification need not include the buffer section 760. Instead of the AND gates in the bad block storage control sections 740 of the test apparatus 70, the test apparatus 70 may include a storage processing section 765 and address control sections 770. The storage processing section 765 is provided in common for the memories under test 100, and sequentially stores, in each universal buffer memory 710, the addresses generated by the address generating section 700, in response to the output of a read command from the command generating section 705 to the memories under test 100. The address control sections 770 are provided to correspond respectively to the memories under test 100. Each address control section 770 stores an address pointer indicating an address of the corresponding universal buffer memory 710 at which the storage processing section 765 is to store data. Each address control section 770 increments the value of the address pointer in response to the corresponding comparing section 730 detecting a discrepancy.

In the example of FIG. 10, two defective blocks have been detected in one of the memories under test 100, and since the address pointer is incremented by 3 for each defective block, the address control section 770 stores a value of 6 as the address pointer value. On the other hand, no defects have been detected yet in the other memory under test 100, and so the address control section 770 sets the address pointer value to be 0, which is the initial value without being incremented.

Other configurations and processes when sending the disable command are substantially the same as those described in FIGS. 7 to 9, and therefore further description is omitted.

In the first modification described above, the test apparatus 70 can test a plurality of memories under test 100 in parallel while independently managing the defective block addresses in each memory under test 100, thereby increasing the efficiency of the following disable process. Furthermore, since the test apparatus 70 need not include the buffer section 760, either this test apparatus 70 or the test apparatus 70 of the previous embodiment may be chosen depending on other circuit elements and specifications in the test apparatus 70.

The following describes a second modification of the embodiment described above, with reference to FIG. 11. In the second modification, the universal buffer memory 710 in the test apparatus 70 stores the defective block addresses in the independent data format output by the address generating section 700, instead of in the format for input to the memory under test 100. After the acceptability judgment is made for each block and the addresses are acquired, during the process for disabling the defective blocks, each converting section 790 provided to the present modification sequentially reads the addresses from the corresponding universal buffer memory 710, converts the read addresses into the format for input to the memory under test 100, and supplies the converted addresses to the corresponding memory under test 100. In this way, the second modification seeks to prevent a decrease in the efficiency of the testing process when the addresses are not acquired in the universal buffer memories 710 after being converted to the input format due to a simpler circuit configuration or the like. The following described a detailed configuration of the second modification.

Figure 11:
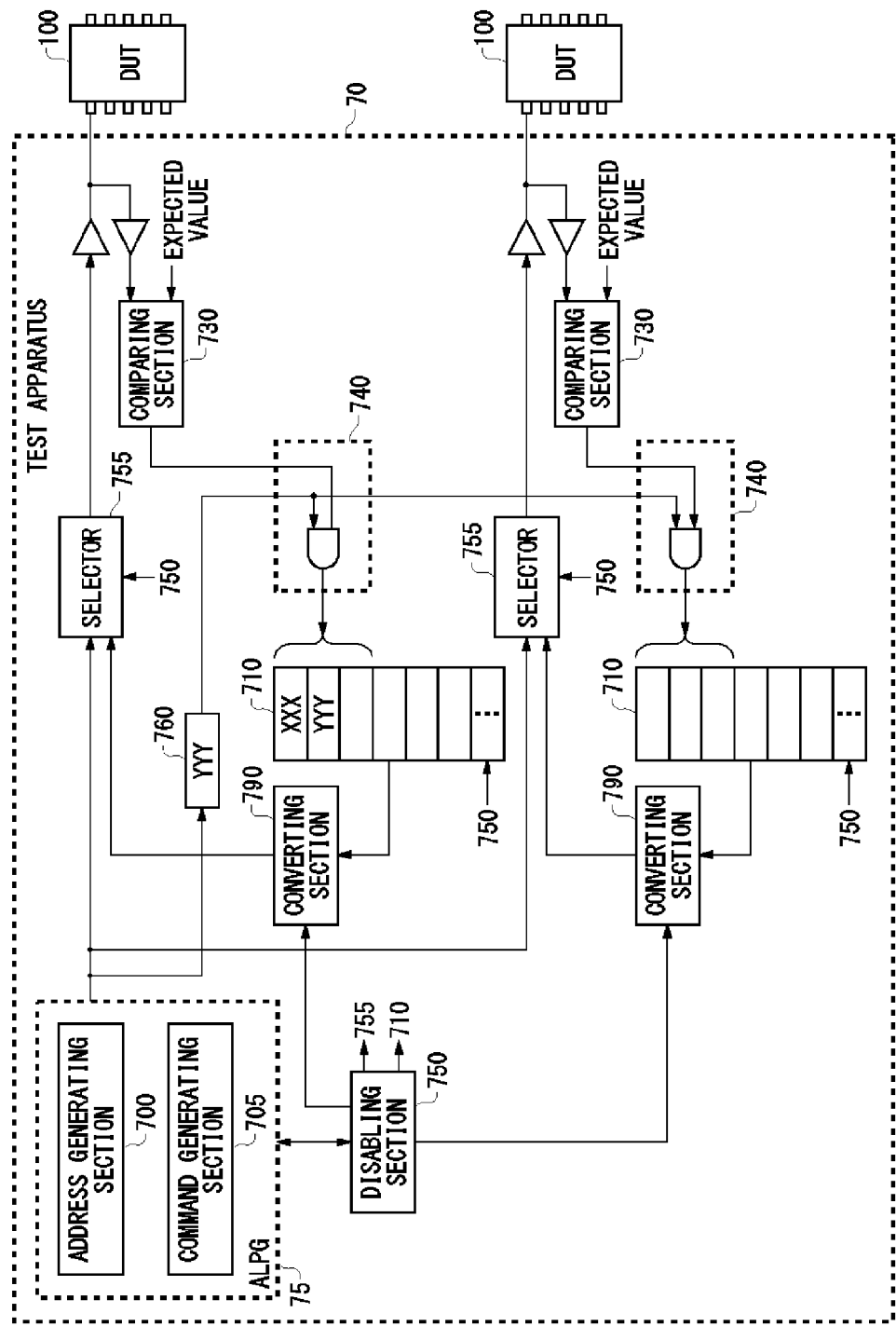
FIG. 11 shows an overall configuration of the test apparatus 70 according to the second modification of the present embodiment.

FIG. 11 shows an overall configuration of the test apparatus 70 according to the second modification of the present embodiment. The test apparatus 70 of the present modification differs from the test apparatus 70 shown in FIGS. 7 to 9 in that the test apparatus 70 of the present modification further includes the converting sections 790. In the same manner as the embodiments described above, the addresses input to the memories under test 100 are obtained by converting the addresses generated by the address generating section 700 into the format for input to the memory under test 100. Each bad block storage control section 740 sequentially stores, in the corresponding universal buffer memory 710, the addresses generated by the address generating section 700 in response to discrepancies detected by the comparing sections 730, and these addresses are stored in the format in which they are in before being converted to the format for input to the memory under test 100. This storage is achieved by the buffer section 760 acquiring the addresses in the independent format generated by the address generating section 700.

More specifically, in the present example, the buffer section 760 acquires YYY from the address generating section 700 as the address in the independent format, and stores this address. This independent-format address is generated by the ALPG 75. For example, upon executing a read program, the ALPG 75 follows instructions of the program to sequentially generate address values. The generated address values are not in the format for input to the memory under test 100, but are instead in an independent format suitable for the computational process of the program. In FIG. 11, such independent-format addresses are represented by XXX, YYY, and the like.

Other processes relating to the acceptability judgment and result acquisition for each block are substantially the same as those described in FIGS. 7 to 9, and therefore further description is omitted.

To perform the disable process, a converting section 790 is provided for each memory under test 100. Each converting section 790 reads the addresses stored in the corresponding universal buffer memory 710 and converts these addresses into the format for input to the memory under test 100. The disabling section 750 instructs the converting sections 790 to convert the addresses, and writes disable data for disabling blocks corresponding to each individual address in the converted addresses.

In both of the modifications described above, the information concerning defective blocks is managed separately for each memory under test 100 and, after testing is completed, the disable process is begun immediately to shorten the overall testing time.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A test apparatus that tests a plurality of memories under test storing data in block-units, comprising:
   an address generating section that is provided in common to the plurality of memories under test, and that sequentially generates addresses to be tested in the memories under test;
   a plurality of buffer memories that are provided to correspond respectively to the plurality of memories under test, and that each store addresses to be independently supplied to the corresponding memory under test;
   a reading section that outputs, to each of the plurality of memories under test, a read command for reading block data stored at each address generated by the address generating section;
   a plurality of comparing sections that are provided to correspond respectively to the plurality of memories under test, and that each compare (i) the block data output by the corresponding memory under test in response to the read command to (ii) an expected value of this block data, for each address generated by the address generating section;

a plurality of bad block storage control sections that are provided to correspond respectively to the plurality of memories under test, and that each sequentially store, in the buffer memory provided to the corresponding memory under test and in response to the comparing section detecting a discrepancy in the comparison, the address generated by the address generating section for reading the block data;

a disabling section that outputs, in parallel to the plurality of memories under test, a disable command for writing disable data that disables blocks corresponding to the addressees stored in the buffer memories, these addresses being included in the disable command as individual addresses; and a buffer section that buffers addresses generated by the address generating section and sequentially updates the buffered addresses each time the address generated by the address generating section changes, wherein the address generating section supplies the buffer section with an address corresponding to a read command from when the read command is output to when a subsequent read command is output, and each bad block storage control section, in response to the corresponding comparing section detecting a discrepancy in the comparison, reads the address from the buffer section and sequentially stores this address in the buffer memory provided to the corresponding memory under test.

2. A test apparatus that tests a plurality of memories under test storing data in block-units, comprising:

an address generating section that is provided in common to the plurality of memories under test, and that sequentially generates addresses to be tested in the memories under test;

a plurality of buffer memories that are provided to correspond respectively to the plurality of memories under test, and that each store addresses to be independently supplied to the corresponding memory under test;

a reading section that outputs, to each of the plurality of memories under test, a read command for reading block data stored at each address generated by the address generating section;

a plurality of comparing sections that are provided to correspond respectively to the plurality of memories under test, and that each compare (i) the block data output by the corresponding memory under test in response to the read command to (ii) an expected value of this block data, for each address generated by the address generating section;

a plurality of bad block storage control sections that are provided to correspond respectively to the plurality of memories under test, and that each sequentially store, in the buffer memory provided to the corresponding memory under test and in response to the comparing section detecting a discrepancy in the comparison, the address generated by the address generating section for reading the block data; and a disabling section that outputs, in parallel to the plurality of memories under test, a disable command for writing disable data that disables blocks corresponding to the addressees stored in the buffer memories, these addresses being included in the disable command as individual addresses, wherein each bad block storage control section includes:

a storage processing section that, in response to output of the read command, sequentially stores the addresses generated by the address generating section in the buffer memory; and an address control section that stores an address pointer indicating an address in the buffer memory to which the storage processing section is to store the address, and that increments a value of the stored address pointer in response to the comparing section detecting a discrepancy in the comparison.

3. A test apparatus that tests a plurality of memories under test storing data in block-units, comprising:

an address generating section that is provided in common to the plurality of memories under test, and that sequentially generates addresses to be tested in the memories under test;

a plurality of buffer memories that are provided to correspond respectively to the plurality of memories under test, and that each store addresses to be independently supplied to the corresponding memory under test;

a reading section that outputs, to each of the plurality of memories under test, a read command for reading block data stored at each address generated by the address generating section;

a plurality of comparing sections that are provided to correspond respectively to the plurality of memories under test, and that each compare (i) the block data output by the corresponding memory under test in response to the read command to (ii) an expected value of this block data, for each address generated by the address generating section;

a plurality of bad block storage control sections that are provided to correspond respectively to the plurality of memories under test, and that each sequentially store, in the buffer memory provided to the corresponding memory under test and in response to the comparing section detecting a discrepancy in the comparison, the address generated by the address generating section for reading the block data; and a disabling section that outputs, in parallel to the plurality of memories under test, a disable command for writing disable data that disables blocks corresponding to the addressees stored in the buffer memories, these addresses being included in the disable command as individual addresses, wherein addresses input to the memories under test are obtained by converting the addresses generated by the address generating section into a format for input to the memories under test, each bad block storage control section, in response to the corresponding comparing section detecting a discrepancy in the comparison, sequentially stores the addresses generated by the address generating section in the corresponding buffer memory, in an original format of the addresses before conversion to the format for input to the memories under test, the test apparatus further comprises a converting section that reads the addresses stored in the buffer memories and converts these addresses into the format for input to the memories under test, and the disabling section instructs the converting section to convert the addresses and outputs the disable command for writing disable data that disables blocks corresponding to the converted addresses included in the disable command as individual address.

4. A method for testing a plurality of memories under test storing data in block-units with a test apparatus, wherein the test apparatus includes:
an address generating section that is provided in common to the plurality of memories under test, and that sequentially generates addresses to be tested in the memories under test;
a plurality of buffer memories that are provided to correspond respectively to the plurality of memories under test, and that each store addresses to be independently supplied to the corresponding memory under test; and
a buffer section that buffers addresses generated by the address generating section and sequentially updates the buffered addresses each time the address generated by the address generating section changes, the method comprising:
outputting, to each of the plurality of memories under test, a read command for reading block data stored at each address generated by the address generating section;
for each of the plurality of memories under test, repeatedly comparing (i) the block data output by the memory under test in response to the read command to (ii) an expected value of this block data, for each address generated by the address generating section;
for each of the plurality of memories under test, sequentially storing, in the buffer memory provided to the memory under test and in response to a discrepancy being detected in the comparison, the address generated by the address generating section for reading the block data;
outputting, in parallel to the plurality of memories under test, a disable command for writing disable data that disables blocks corresponding to the addressees stored in the buffer memories, these addresses being included in the disable command as individual addresses;
supplying the buffer section with an address corresponding to a read command from when the read command is output to when a subsequent read command is output; and
for each of the plurality of memories under test, in response to a discrepancy being detected in the comparison, reading the address from the buffer section and sequentially storing this address in the buffer memory provided to the corresponding memory under test.

5. A method for testing a plurality of memories under test storing data in block-units with a test apparatus, wherein the test apparatus includes:
an address generating section that is provided in common to the plurality of memories under test, and that sequentially generates addresses to be tested in the memories under test; and
a plurality of buffer memories that are provided to correspond respectively to the plurality of memories under test, and that each store addresses to be independently supplied to the corresponding memory under test, the method comprising:
outputting, to each of the plurality of memories under test, a read command for reading block data stored at each address generated by the address generating section;
for each of the plurality of memories under test, repeatedly comparing (i) the block data output by the memory under test in response to the read command to (ii) an expected value of this block data, for each address generated by the address generating section;
for each of the plurality of memories under test, sequentially storing, in the buffer memory provided to the memory under test and in response to a discrepancy being detected in the comparison, the address generated by the address generating section for reading the block data, the step of sequentially storing including:
sequentially storing the addresses generated by the address generating section in the buffer memory in response to output of the read command; and
in response to a discrepancy being detected in the comparison, incrementing a value of a stored address pointer indicating an address in the buffer memory to which the address is to be stored; and
outputting, in parallel to the plurality of memories under test, a disable command for writing disable data that disables blocks corresponding to the addressees stored in the buffer memories, these addresses being included in the disable command as individual addresses.

6. A method for testing a plurality of memories under test storing data in block-units with a test apparatus, wherein the test apparatus includes:
an address generating section that is provided in common to the plurality of memories under test, and that sequentially generates addresses to be tested in the memories under test; and
a plurality of buffer memories that are provided to correspond respectively to the plurality of memories under test, and that each store addresses to be independently supplied to the corresponding memory under test, the method comprising:
outputting, to each of the plurality of memories under test, a read command for reading block data stored at each address generated by the address generating section;
for each of the plurality of memories under test, repeatedly comparing (i) the block data output by the memory under test in response to the read command to (ii) an expected value of this block data, for each address generated by the address generating section; and
for each of the plurality of memories under test, sequentially storing, in the buffer memory provided to the memory under test and in response to a discrepancy being detected in the comparison, the address generated by the address generating section for reading the block data, wherein
addresses input to the memories under test are obtained by converting the addresses generated by the address generating section into a format for input to the memories under test, and
in the step of sequentially storing, the addresses are stored in an original format of the addresses before conversion to the format for input to the memories under test, the method further comprising:
reading the addresses stored in the buffer memories and converting these addresses into the format for input to the memories under test; and
outputting, in parallel to the plurality of memories under test, a disable command for writing disable data that disables blocks corresponding to the converted addresses, these addresses being included in the disable command as individual addresses.

* * * * *